United States Patent [19]
Smith et al.

[11] Patent Number: 5,621,331
[45] Date of Patent: Apr. 15, 1997

[54] AUTOMATIC IMPEDANCE MATCHING APPARATUS AND METHOD

[75] Inventors: Donald K. Smith, Belmont, Mass.; Brian D. McVey, Santa Fe, N.M.; Richard A. Rameriz, Norwood, Mass.

[73] Assignee: Applied Science and Technology, Inc., Woburn, Mass.

[21] Appl. No.: 500,411

[22] Filed: Jul. 10, 1995

[51] Int. Cl.$^6$ .................................................. G01R 27/04
[52] U.S. Cl. ........................... 324/645; 324/637; 324/638
[58] Field of Search ................................. 324/643, 638, 324/637, 639, 642

[56] References Cited

U.S. PATENT DOCUMENTS

| | | | |
|---|---|---|---|
| 4,427,936 | 1/1984 | Riblet et al. | 324/638 |
| 4,507,602 | 3/1985 | Aguirre | 324/638 |
| 4,521,728 | 6/1985 | Li | 324/638 |
| 5,274,333 | 12/1993 | Ghannouch | 324/638 |

FOREIGN PATENT DOCUMENTS 3-263828  11/1991  Japan .......................... H01L 21/302

*Primary Examiner*—Maura K. Regan
*Attorney, Agent, or Firm*—Testa, Hurwitz & Thibeault, LLP

[57] ABSTRACT

Methods for rapidly adjusting the impedance of a variable impedance apparatus to match the impedance of a source to the impedance of a load, where the load impedance is a nonlinear function of the power delivered to the load, are described. In addition, an automatic impedance matching apparatus for matching the impedance of a source to the impedance of a load and for maintaining a stable plasma are described. The apparatus includes a variable impedance apparatus, a plurality of electric field sensors, a photosensitive detector, a data processor, and a memory.

14 Claims, 3 Drawing Sheets

AUTOMATIC IMPEDANCE MATCHING APPARATUS AND METHOD

FIELD OF THE INVENTION

The invention relates generally to the field of microwave systems. In particular, the invention relates to an apparatus and method for matching the impedance of a source to the impedance of a load and methods of operating microwave stub tuners.

BACKGROUND OF THE INVENTION

In a waveguide system having a source and a load, it is desirable to transfer all of the energy generated by the source to the load. If a mismatch exists in the waveguide system, a standing wave is established in the waveguide and some of the energy is reflected back to the source. The standing wave can be canceled at any particular frequency by introducing an additional mismatch elsewhere in the waveguide system whose reflection coefficient is in anti-phase with that of the original mismatch.

Typically, a stub tuner or a matching section is used to introduce the additional mismatch into the system. Stub tuners are capable of providing an impedance match between a source and a load over a broadband of frequencies. Stub tuners typically consist of lengths of waveguide with either a single dielectric or metallic stub which is variable in position along the waveguide or multiple stubs at fixed positions in the waveguide whose penetrations into the waveguide can be individually varied. The stubs typically provide a variable capacitive susceptance.

Stub tuners produce a variable mismatch with a variable phase. For a single stub tuner, a variable mismatch is achieved by varying the insertion of the stub into the waveguide and a variable phase is produced by varying the position of the stub along the axis of the waveguide. For a multi-stub tuner, a variable phase is achieved by inserting two or more stubs with a particular spacing into the waveguide. Theoretically any mismatch could be canceled using three stubs, although four or five stubs are occasionally utilized to achieve greater versatility.

In microwave systems having a source and a load, it is desirable to have a multi-stub tuner that automatically adjusts the stubs to positions which establish an additional mismatch in the system which results in the source impedance matching the load impedance. To achieve an impedance match between the source and the load, the additional mismatch must have a reflection coefficient that is in antiphase with that of the original mismatch. Such a multi-stub tuner is particularly desirable for microwave plasma systems because the state of the plasma and thus the impedance of the plasma may change rapidly. If automatic impedance adjusting is performed fast enough, a stable plasma can be achieved for various conditions.

U.S. Pat. No. 5,079,507 discloses an automatic impedance adjusting apparatus and methods for microwave systems. This patent discloses an apparatus and methods which initially measure either an impedance or a reflection coefficient associated with a microwave load at a predetermined reference point on a microwave waveguide connecting the source to the load. Then a variable impedance apparatus, such as a three-stub tuner, positioned on the load side of the reference point, is adjusted so that the impedance associated with the microwave load is a predetermined value of impedance. This predetermined value of impedance is calculated to match the impedance of the source to the impedance of the load or to achieve a predetermined value of mismatch. This method is typically repeated until the source impedance actually matches the impedance of the load or the predetermined value of mismatch is achieved.

The apparatus and method described in the patent may rapidly match the source impedance to the load impedance when the load impedance is fixed. Unfortunately, many loads, such as plasmas, have an impedance that is a nonlinear function of the power delivered to the load. When such apparatus and methods are utilized with such nonlinear loads, the variable impedance apparatus may iterate without converging (this phenomena is known as hunting in servomechanical systems) or may slowly but erratically converge to an impedance which matches the impedance of the source to the impedance of the load. The nonconvergence or slow, unstable or erratic convergence, may result in an unstable plasma and may even cause the plasma condition to terminate. In a semiconductor plasma processing apparatus, this is particularly problematic since having a stable plasma is critical to achieving uniform etching and thin film deposition rates.

It is therefore a principal object of this invention to provide an impedance matching apparatus and method which rapidly adjusts the impedance of a variable impedance apparatus to match the impedance of a source to the impedance of a load, where the load impedance is a nonlinear function of the power delivered to the load. It is another object of this invention to provide an impedance matching apparatus and method which maintain a stable plasma. It is another object to accurately model a multi-stub tuner at high voltage standing wave ratios using scattering parameters.

It is another object to provide a photosensitive detector and a spectrometer or a filter for indicating that a plasma or a plasma chemistry exists. Other objects are to provide a look-up table for determining the appropriate stub positions for initially establishing the plasma or the plasma chemistry and a second look-up table for matching the source impedance to the load impedance when the photosensitive detector indicates that the plasma or the plasma chemistry exists.

SUMMARY OF THE INVENTION

A principal discovery of this invention is that an automatic impedance adjusting apparatus converges faster for nonlinear loads and matches a wider variety of nonlinear loads when it iteratively adjusts its impedance towards an impedance which matches the impedance of the source to the impedance of the load. Specifically, an automatic impedance adjusting system which utilizes a multi-stub tuner, achieves faster and more stable convergence and matches a wider variety of nonlinear loads if the stub displacements that theoretically match the source impedance to the load impedance, are scaled by a factor. Moreover, if the scaling factor is proportional to the magnitude of the reflection coefficient referenced to the load, the convergence and stability are enhanced.

Accordingly, the present invention features a method of matching a source impedance to a load impedance in a waveguide system using a multi-stub tuner positioned between the source and the load and having initial stub positions. The multi-stub tuner may be a three-stub tuner. The method includes determining a reflection coefficient associated with the load. The reflection coefficient associated with the load may be determined by measuring a reflection coefficient associated with the multi-stub tuner and the load referenced to a source end of the multi-stub tuner and then calculating the reflection coefficient referenced to a load end of the multi-stub tuner from the measurement and from known characteristics of the multi-stub tuner. The reflection coefficient associated with the multi-stub tuner and the load may be measured by receiving signals from a plurality of detectors positioned along a waveguide between the source and the multi-stub tuner.

The scattering parameters of the multi-stub tuner are determined. The scattering parameters may be determined by determining the magnitude of the reflection coefficient at the source end and the phases of reflection coefficients at the source and load ends for each pair of stubs in the multi-stub tuner. In addition, the scattering parameters of the multi-stub tuner that theoretically match the source impedance to the load impedance are determined. The scattering parameters that theoretically match the source impedance to the load impedance may be determined by choosing the scattering parameters that make the reflection coefficient at the load end of the multi-stub tuner equal to a complex conjugate of the load reflection coefficient.

Stub displacements from the initial stub positions to positions corresponding to a condition where the scattering parameters of the multi-stub tuner theoretically match the source impedance to the load impedance are determined. The stub displacements are determined from the initial stub positions and from the predetermined characteristics of the multi-stub tuner. The initial stub positions may be predetermined stub positions corresponding to scattering parameters known to cause formation of a plasma or a particular plasma chemistry.

The stub displacements are scaled by combining them with a scaling factor. The scaling factor may be combined by multiplication. The scaling factor may be a function of the magnitude of the reflection coefficient associated with the load. The stubs are then moved a distance corresponding to the scaled stub displacements. The method is then repeated until the magnitude of the reflection coefficient is less than a predetermined value. The predetermined value may be 0.1 corresponding to 1% reflected power.

The method may further comprise the step of providing a data processor and memory. The method may thus include the step of storing the initial stub positions corresponding to scattering parameters known to cause formation of a plasma or a plasma chemistry in the memory and moving the stubs to those positions before attempting to establish the plasma or the plasma chemistry. The method may also include the step of storing stub positions and corresponding scattering parameters that theoretically match the source to particular loads in the memory. The stub displacements from the initial stub positions to the positions corresponding to scattering parameters that theoretically match the source to particular loads may, thus, be determined by recalling stored stub positions which correspond to the scattering parameters that theoretically match the source to particular loads.

The present invention also features a method of determining stub positions of a multi-stub tuner that match a source to a load using scattering parameters. The multi-stub tuner may be a three-stub tuner. The method includes determining composite scattering parameters for a first pair of stubs separated by a waveguide section for a plurality of stub positions and storing the stub positions that correspond to a first range of composite scattering parameters. In addition, the method includes determining composite scattering parameters for a second pair of stubs separated by a waveguide section for a plurality of stub positions and storing the stub positions that correspond to a second range of composite scattering parameters.

The composite scattering parameters for the first and second pair of stubs in the multi-stub tuner may be determined for each position by combining the scattering parameters caused by each stub independently and the waveguide sections between the pairs of stubs. The length of the waveguide section between the first pair of stubs may be chosen to allow the phase of a composite reflection coefficient at the load end of the multi-stub tuner to be variable from at least 0 through +180 degrees by changing the position of the stubs. In addition, the length of the waveguide section between the second pair of stubs may be chosen to allow the phase of a composite reflection coefficient at the load end of the multi-stub tuner to be variable from at least 0 through −180 degrees by changing the position of the stubs.

The method also includes the step of determining a load reflection coefficient. The load reflection coefficient may be determined by first measuring a reflection coefficient associated with the combination of the multi-stub tuner and the load referenced to a source end of the multi-stub tuner. Then the reflection coefficient referenced to a load end of the multi-stub tuner is calculated from the measurement and from known characteristics of the multi-stub tuner. The reflection coefficient associated with the multi-stub tuner and the load may be measured by receiving signals from a plurality of detectors positioned along a waveguide between the source and the multi-stub tuner.

The stub positions that match the source impedance to the load impedance are determined by recalling the stored stub positions that correspond to a reflection coefficient at the load end of the multi-stub tuner that equals a complex conjugate of the load reflection coefficient. The reflection coefficient at the load end of the multi-stub tuner that equals a complex conjugate of the load reflection coefficient is determined from the composite scattering parameters of the first and second pair of stubs and from known characteristics of the multi-stub tuner.

The method may further include the step of providing a data processor and memory. The method may thus include the step of repeating the method for various load reflection coefficients and storing stub positions corresponding to the complex conjugate of the various load reflection coefficients in the memory. The stored stub positions corresponding to the complex conjugate of the various load reflection coefficients may be recalled and utilized to estimate the stub positions to achieve a match between the source and a particular load. Thus, the steps of determining the composite scattering parameters for the first and second pair of stubs, may be eliminated and the step of recalling the stored stub positions that correspond to the complex conjugate of a particular load can be achieved by recalling the stored stub positions from the memory.

The present invention also features a plasma processing system which includes a plasma applicator for processing material. In addition, the system includes an autotuning device coupled to the plasma applicator and a power source by a waveguide for matching an impedance of the plasma applicator to an impedance of the power source. The autotuning device may include a multi-stub tuner having electronically controlled motors which position stubs within the tuner. A plurality of electric field sensors may be positioned along the waveguide for measuring a reflection coefficient associated with the plasma applicator. A data processor and a memory responsive to the plurality of sensors and the motors may be included for instructing the motors to position the stubs within the tuner according to a predetermined program.

The plasma processing system also includes a photosensitive detector optically coupled to the plasma applicator for indicating that a plasma condition exists. The plasma processing system may further include a spectrometer or filter optically coupled to the photosensitive detector for detecting the presence of a plasma or a particular plasma chemistry.

The stub positions corresponding to the formation of the plasma or the particular plasma chemistry may be stored in the memory. The data processor may be used for determining the stored stub positions by recalling the stub positions corresponding to the formation of the plasma or the particular plasma chemistry and for positioning the stubs to the stored positions prior to attempting to form a plasma condition.

The stub positions corresponding to a match between the impedance of the plasma applicator and the impedance of the power source for the plasma or the particular plasma chemistry may be stored in the memory. The data processor may be used for recalling the stored stub positions corresponding to the match between the impedance of the plasma applicator and the impedance of the power source for the plasma or the particular plasma chemistry and for instructing the motors to position the stubs to the stored positions.

BRIEF DESCRIPTION OF THE DRAWINGS

The foregoing and other objects, features and advantages of the invention will become apparent from the following more particular description of preferred embodiments of the invention, as illustrated in the accompanying drawings. The drawings are not necessarily to scale, emphasis instead being placed on illustrating the principles of the present invention.

DETAILED DESCRIPTION

Figure 1:
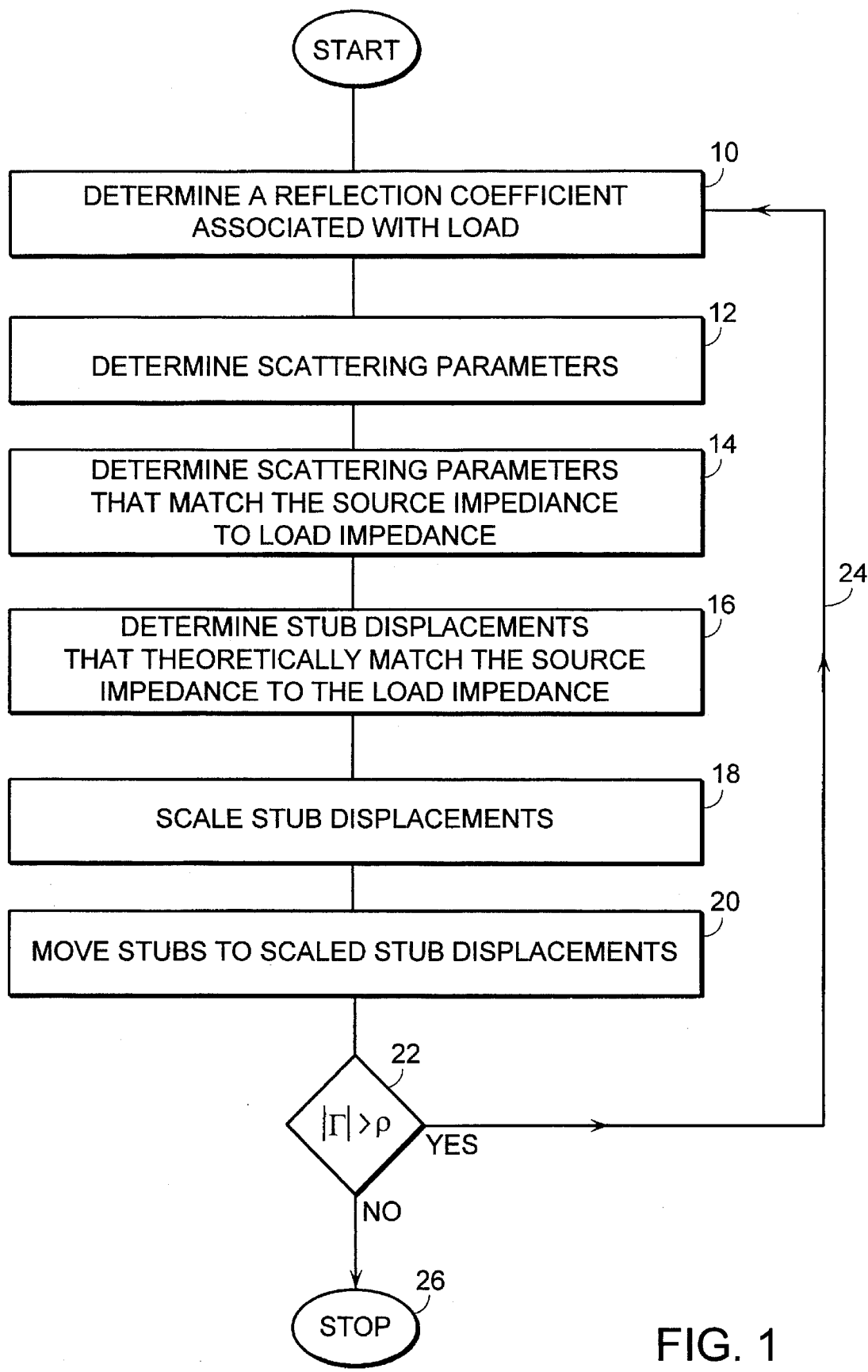
FIG. 1 is a flow chart of a method of matching a source impedance to a load impedance in a waveguide system using a multi-stub tuner.

FIG. 1 is a flow chart of a method of matching a source impedance to a load impedance in a waveguide system using a variable impedance apparatus positioned between a source and a load. The variable impedance apparatus is typically a multi-stub tuner such as a three-stub tuner having initial stub positions. The method, however, can be used with a stub tuner having any number of stubs. The method includes determining a reflection coefficient associated with the load 10. The reflection coefficient associated with the load may be determined by first measuring a reflection coefficient associated with the multi-stub tuner and the load referenced to a source end of the multi-stub tuner. Then the reflection coefficient referenced to a load end of the multi-stub tuner is calculated from the measurement and from known characteristics of the multi-stub tuner. The reflection coefficient associated with the multi-stub tuner and the load may be measured by receiving signals from a plurality of detectors positioned along a waveguide between the source and the multi-stub tuner.

The multi-stub tuner is characterized by determining its scattering parameters 12. Characterizing the tuner by its scattering parameters is advantageous because a scattering parameter model of the tuner will accurately represent the tuner over its entire range of stub positions. The scattering parameters of the tuner are defined by the reflection coefficients at both the source and load ends of the tuner ($S_{11}$, $S_{22}$), and the wave transmission coefficients through the tuner ($S_{12}$, $S_{21}$). For a single stub tuner, the magnitude and phase of the reflection coefficient at the source end ($S_{11}$) characterizes the tuner. For a multi-stub tuner, the magnitude of the reflection coefficient at the source end ($S_{11}$) and the phases of reflection coefficients at the source and load ends ($S_{11}$ and $S_{22}$) are required to characterize each pair of stubs in the multi-stub tuner.

The use of scattering parameters to model the tuner differs from prior art tuners in which each stub is modeled by only a shunt susceptance. For large voltage standing wave ratios (VSWRs), the stubs must be modeled by a reactance in series with the shunt susceptance. A more accurate model of the tuner at high VSWR is deskable because a high VSWR is required to establish a plasma condition.

The scattering parameters of the multi-stub tuner that theoretically match the source impedance to the load impedance are determined 14. The scattering parameters may be determined by choosing the scattering parameters that make the reflection coefficient at the load end of the multi-stub tuner equal to a complex conjugate of the reflection coefficient associated with the load.

Stub displacements from the initial stub positions to positions corresponding to scattering parameters of the multi-stub tuner that theoretically match the source impedance to the load impedance are determined 16. The stub displacements are determined from the initial stub positions and from the predetermined characteristics of the multi-stub tuner. The initial stub positions may be predetermined stub positions corresponding to scattering parameters known to cause formation of a plasma or a particular plasma chemistry.

The stub displacements are scaled by combining the stub displacements with a scaling factor 18. The scaling factor may be combined with the stub displacement by multiplication. The scaling factor may be a function of the magnitude of the reflection coefficient associated with the load. The stubs are then moved a distance corresponding to the scaled stub displacements 20.

The magnitude of the reflection coefficient is then compared with a predetermined value, ρ22. If the magnitude of the reflection coefficient is greater than the predetermined value ρ, the method is repeated 24. If the magnitude of the reflection coefficient is less than the predetermined value ρ, the method is terminated 26. The predetermined value ρ, may be 0.1. This corresponds to when the reflected power is 1%.

The method may further comprise the step of providing a data processor and a memory. The data processor and memory may be utilized to compute new stubs displacements, X(new), Y(new), Z(new) with an algorithm. The algorithm may compute the new stub positions by executing the following steps:

X(new)=X(initial)+[X(theoretical)−X(initial)]*N

Y(new)=Y(initial)+[Y(theoretical)−Y(initial)]*N

Z(new)=Z(initial)+[Z(theoretical)−Z(initial)]*N where X,Y,Z(theoretical)−X,Y,Z (initial) are the stub displacements from the initial stub positions to positions which correspond to scattering parameters of the multi-stub tuner match that theoretically match the source impedance to the load impedance. The factor N is a scaling factor.

In this embodiment, the scaling factor, N, is combined with the stub displacement by multiplication. Once the stubs are moved to the new positions, the previously determined new stub positions become the initial stub positions for the next iteration. New stub positions are again calculated by executing the above steps. The steps are repeated until the magnitude of the reflection coefficient is below the predetermined value.

The scaling factor is typically less than 1. In this embodiment, the scaling factor is directly proportional to the reflection coefficient. Thus, as the stub positions converge to positions which match the impedance of the source to the impedance of the load, the scaling factor reduces thereby causing the stub displacements to reduce. This reduction in stub displacement provides stability when attempting to match a source to a nonlinear load such as a plasma, which has an impedance that is a nonlinear function of the power delivered to the load. In addition, the reduction in stub displacement compensates for inaccuracies in the scattering parameter model of the multi-stub tuner and for inaccuracies in the measurement of the reflection coefficient associated with the load.

The method of FIG. 1 converges rapidly and matches a wide variety of nonlinear loads. These advantages occur because the method reduces the stub displacements that theoretically match the impedance of the source to the impedance of the load by combining them with a scaling factor. The stub positions thus iterate towards actual stub positions which match the impedance of the source to the impedance of the load.

The method of FIG. 1 differs from the prior art methods which directly move the stubs to positions that theoretically match the impedance of the source to the impedance of the load. The prior art methods tend to overshoot the stub displacements which actually match the impedance of the source to the impedance of the load and thus these methods have poor convergence. The present invention realizes that the load impedance is a nonlinear function of the power delivered to the load and appropriately scales the stub positions that theoretically match the impedance of the source to the impedance of the load.

The data processor and memory may also be used to preset the initial stub positions for rapidly matching the source to particular loads. The method may thus include the step of storing stub positions and corresponding scattering parameters that match the source to particular loads in the memory. For example, the method may include the step of storing stub positions and corresponding scattering parameters in the memory that match the source to particular plasmas, which are characterized by parameters such as gas composition, gas pressure, and bias conditions. Thus, by using the data processor and memory, the step of determining stub displacements from the initial stub positions to positions corresponding to scattering parameters of the multi-stub tuner that theoretically match the source impedance to the load impedance 16, may be accomplished by recalling stored stub positions which correspond to the scattering parameters that match the source to the particular load.

The data processor and memory may also be used to preset the initial stub positions for some initial condition such as rapidly establishing a plasma in a microwave plasma system. The method may thus include the step of storing the initial stub positions corresponding to scattering parameters known to cause formation of a plasma or a particular plasma chemistry in the memory and moving the stubs to those positions before attempting to establish a plasma condition.

Figure 2:
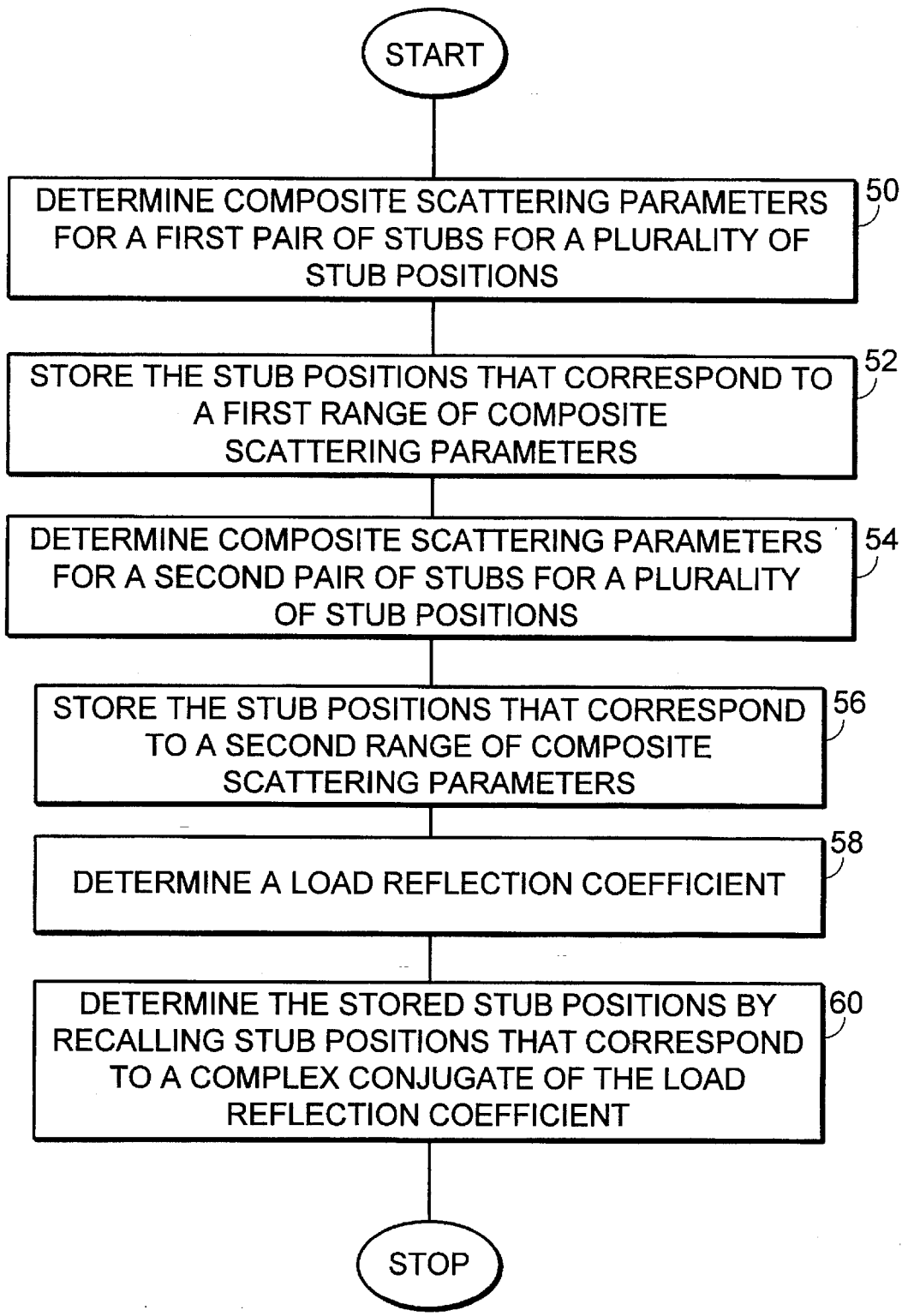
FIG. 2 is a flow chart of a method of determining stub positions of a multi-stub tuner that match a source to a load using scattering parameters.

FIG. 2 is a flow chart of a method of determining stub positions of a multi-stub tuner that match a source impedance to a load impedance using scattering parameters. In one embodiment, the multi-stub tuner is a three-stub tuner. The method includes the step of determining composite scattering parameters for a first pair of stubs separated by a waveguide section for a plurality of stub positions 50. The stub positions that correspond to a first range of composite scattering parameters are stored 52. In addition, the method includes the step of determining composite scattering parameters for a second pair of stubs separated by a waveguide section for a plurality of stub positions 54. The stub positions that correspond to a second range of composite scattering parameters are stored 56.

In this embodiment, the composite scattering parameters for the first and second pair of stubs in the multi-stub tuner are determined for each position by mathematically combining the scattering parameters caused by each stub independently and the waveguide sections between the pairs of stubs. The length of the waveguide section between the first pair of stubs is chosen to allow the phase of a composite reflection coefficient at the load end of the multi-stub tuner to be variable from at least 0 through +180 degrees by changing the position of the stubs. In addition, the length of the waveguide section between the second pair of stubs is chosen to allow the phase of a composite reflection coefficient at the load end of the multi-stub tuner to be variable from at least 0 through −180 degrees by changing the position of the stubs. Choosing the lengths of the waveguide sections between the first and second pair of stubs, such that there is some overlap in possible phases of the composite reflection coefficient at the load end of the multi-stub tuner, will minimize excessive motion of the stubs for phases near 0 and 180 degrees.

The method also includes the step of determining a load reflection coefficient 58. In this embodiment, the load reflection coefficient is determined by first measuring a reflection coefficient associated with the combination of the multi-stub tuner and the load referenced to a source end of the multi-stub tuner. Then the reflection coefficient referenced to a load end of the multi-stub tuner is calculated from the measurement and from known characteristics of the multi-stub tuner. The reflection coefficient associated with the multi-stub tuner and the load may be measured by receiving signals from a plurality of detectors positioned along a waveguide between the source and the multi-stub tuner.

The stub positions that match the source impedance to the load impedance are determined by the step of recalling the stored stub positions that correspond to a reflection coefficient at the load end of the multi-stub tuner that equals a complex conjugate of the load reflection coefficient 60. The reflection coefficient at the load end of the multi-stub tuner that equals a complex conjugate of the load reflection coefficient is determined from the composite scattering parameters of the first and second pair of stubs and from known characteristics of the multi-stub tuner.

The method may further include the step of providing a data processor and memory. The method may thus include the step of repeating the method for various load reflection coefficients and storing stub positions corresponding to the complex conjugate of the various load reflection coefficients in the memory. The stored stub positions corresponding to the complex conjugate of the various load reflection coefficients may be recalled and utilized to estimate the stub positions which will achieve a match between the source and a particular load. Thus, in another embodiment the steps of determining the composite scattering parameters for the first and second pair of stubs and storing the composite scattering parameters for the plurality of stub positions 50–56 may be eliminated, and the step of recalling the stored stub positions that correspond to the complex conjugate of a particular load can be achieved by recalling stub positions from the memory.

Figure 3:
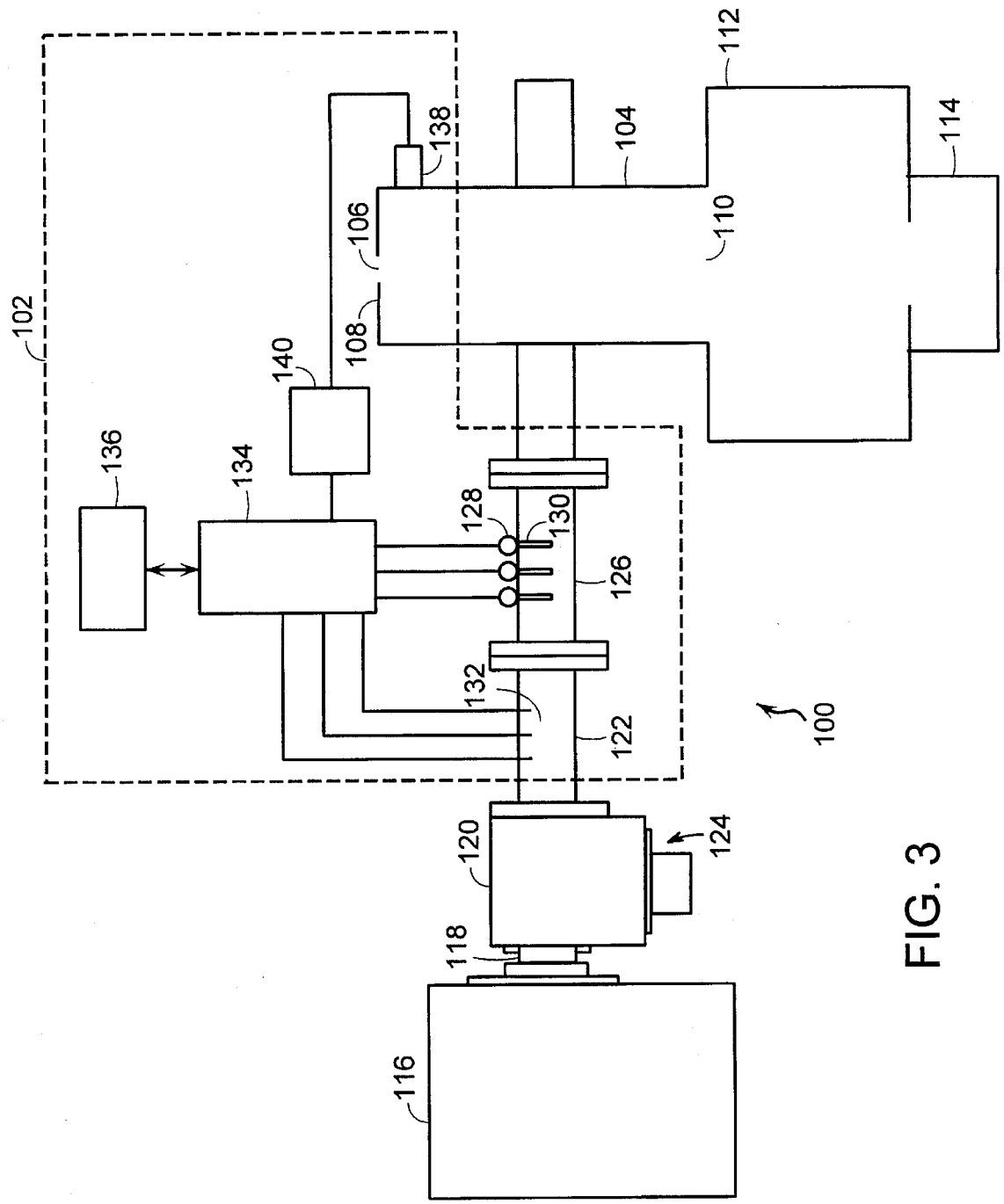
FIG. 3 illustrates an embodiment of a plasma processing system incorporating an autotuning device.

FIG. 3 illustrates an embodiment of a plasma processing system 100 incorporating an autotuning device 102. The system includes a plasma applicator 104 for processing material. The plasma applicator 104 is typically made of a material which is substantially transparent to microwave energy and has suitable mechanical, thermal, and chemical properties for plasma processing. Typical materials include quartz, sapphire, and alumina. A gas inlet 106 positioned at a top 108 of the plasma applicator 104 allows process gasses to be introduced into the plasma applicator 104. The bottom 110 of the plasma applicator 104 is coupled to a vacuum chamber 112. A vacuum pump 114 is used to evacuate the chamber 112.

A magnetron power source 116 generates the microwave energy required to create and sustain a plasma in the plasma applicator 104. An output 118 of the magnetron 116 is coupled to a circulator 120 which allows the microwave energy to pass unrestricted to a waveguide 122 which is coupled to the plasma applicator 104. The waveguide 122 transports the microwave energy to the plasma applicator 104. In addition, the circulator 120 directs the microwave energy reflected by the plasma applicator 104 to a dummy load 124 so as not to damage the magnetron 116.

The autotuning device 102 is coupled between the circulator 120 and the plasma applicator 104. The autotuning device 102 perturbs the electromagnetic fields in the waveguide 122 and is typically adjusted to minimize the microwave energy reflected from the plasma applicator 104. The autotuning device 102 may also be adjusted to achieve a predetermined value of mismatch between the power source 116 and the plasma applicator 104.

In one embodiment, the autotuning device 102 includes a multi-stub tuner 126 which has electronically controlled motors 128 that position stubs 130 within the tuner 126. A plurality of electric field sensors 132 is positioned along the waveguide 122 for measuring a reflection coefficient associated with the plasma applicator 104. In another embodiment, a reflectometer (not shown) may be used to measure the reflection coefficient associated with the plasma applicator 104. A data processor 134 and a memory 136, which are responsive to the plurality of sensors 132 and the motors 128, instruct the motors 128 to position the stubs 130 according to a predetermined program.

The plasma processing system 100 also includes a photosensitive detector 138 optically coupled to the plasma applicator 104 for indicating that a plasma condition exists. The plasma processing system 100 may further include a spectrometer 140 or at least one optical filter (not shown) optically coupled to the photosensitive detector 138 for detecting the presence of a particular plasma chemistry.

The stub positions corresponding to formation of a plasma or a particular plasma chemistry may be stored in the memory 136 as plasma start presets. The data processor 134 may recall the plasma start presets and instruct the motors 128 to position the stubs 130 to the plasma start presets prior to attempting to establish the plasma or the particular plasma chemistry.

The data processor 134 may execute an algorithm which considers the previous stub positions that correspond to formation of the plasma or the particular plasma chemistry, and determines plasma start presets which are the most likely stub positions to establish the plasma or the particular plasma chemistry. The data processor 134 then instructs the motors 128 to position the stubs 130 to the plasma start presets prior to attempting to establish the plasma or the particular plasma chemistry.

In another embodiment, the data processor 134 computes a running average of each stub position which caused the formation of the plasma or the particular plasma chemistry for any number of previous plasma formation events. The data processor 134 then instructs the motors 128 to position the stubs 130 to the running average stub positions prior to attempting to establish the plasma or particular plasma chemistry.

The stub positions corresponding to a match between the impedance of the plasma applicator 104 and the impedance of the power source 116 for the plasma or the particular plasma chemistry may be stored in the memory 136 as impedance match presets. The data processor 134 may be used for recalling the impedance match presets for the plasma or the particular plasma chemistry and for instructing the motors 128 to position the stubs 130 to the impedance match preset.

In another embodiment, the data processor 134 executes an algorithm that recalls several impedance match presets for the plasma or the particular plasma chemistry, and then calculates the stub positions which are most likely to match the impedance of the plasma applicator 104 to the impedance of the power source 116. After a plasma condition is established, the data processor 134 instructs the motors 128 to position the stubs 130 to the stub positions which are most likely to match the impedance of the plasma applicator 104 to the impedance of the power source 116.

In another embodiment, the data processor 134 computes a running average of each stub position which caused an acceptable impedance match for the plasma or the particular plasma chemistry. The acceptable impedance match is determined by evaluating the magnitude of the reflection coefficient associated with the plasma. After a plasma condition is established, the data processor 134 instructs the motors 128 to position the stubs 130 to the running average stub positions which caused an acceptable impedance match for the plasma or the particular plasma chemistry after a plasma condition is established.

In another embodiment, the data processor 134 instructs the motors 128 to position the stubs 130 according to a predetermined sequence preset. The sequence preset may include a plasma start preset and any number of impedance match presets. The data processor 134 may instruct the motors 128 to position the stubs 130 to the plasma start preset for a predetermined time. If a plasma condition is not sensed by the photosensitive detector 138, the data processor 134 may execute an autotuning algorithm to increase the probability of forming a plasma condition.

An external electronic signal, such as one caused by establishing a contact or transmitting a command to the data processor 134, may be used to initiate positioning the stubs 130 to a preset or may be used to initiate a sequence preset. For example, when the photosensitive detector 138 indicates the termination of a plasma condition, the data processor 134 may instruct the motors 128 to move the stubs 130 to a start preset. In another embodiment, the data processor 134 may execute an algorithm that considers data from the plurality of sensors 132 or the photosensitive detector 138 and decides whether to initiate positioning the stubs 130 to a preset.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims. For example, although the invention is described in connection with a three-stub tuner, it is noted that an impedance adjusting apparatus with any number of stubs can be used without departing from the spirit and scope of the invention.

What is claimed is:

1. A method of impedance matching a source to a load using a multi-stub tuner positioned between the source and the load comprising:
   a) determine a reflection coefficient associated with the load;
   b) determining scattering parameters of the multi-stub tuner;
   c) determining scattering parameters of the multi-stub tuner that theoretically match the source impedance to the load impedance;
   d) determining stub displacements from current stub positions of the multi-stub tuner to positions corresponding to the scattering parameters of the multi-stub tuner that theoretically match the source impedance to the load impedance provided that the load impedance remains constant as the stub positions are varied;
   e) determining scaled stub displacements by combining the stub displacements with a scaling factor;
   f) moving the stubs a distance corresponding to the scaled stub displacements; and
   g) repeating steps a–f until the magnitude of the reflection coefficient is less than a predetermined value.

2. The method of claim 1 further comprising the step of providing a data processor and memory.

3. The method of claim 1 wherein the scaling factor is a function of the reflection coefficient.

4. The method of claim 1 wherein the step of combining the stub displacements with a scaling factor comprises multiplying the displacement by a scaling factor.

5. The method of claim 1 wherein the step of determining the reflection coefficient associated with a load comprises:
   a) measuring the reflection coefficient associated with the multi-stub tuner and the load referenced to a source end of the multi-stub tuner; and
   b) calculating the reflection coefficient referenced to a load end of the multi-stub tuner from the measurement taken in step a and from known characteristics of the multi-stub tuner.

6. The method of claim 1 wherein the step of determining scattering parameters that theoretically match the source impedance to the load impedance comprises determining scattering parameters that make a reflection coefficient at the load end of the tuner equal to a complex conjugate of the load reflection coefficient.

7. The method of claim 2 further comprising the step of storing stub positions and corresponding scattering parameters that match the source impedance to the load impedance in the memory.

8. The method of claim 7 wherein the step of determining the stub displacements from the initial stub positions to the positions corresponding to the scattering parameters that theoretically match the source impedance to the load impedance comprises recalling stored stub positions which correspond to the scattering parameters.

9. The method of claim 1 wherein the initial stub positions are predetermined stub positions corresponding to scattering parameters known to cause formation of a plasma.

10. The method of claim 2 further comprising the step of storing stub positions that cause formation of a plasma in the memory and moving the stubs to those initial stub positions before performing step d.

11. The method of claim 1 wherein the step of determining the scattering parameters of the multi-stub tuner that theoretically match the source impedance to the load impedance comprises determining the magnitude of the reflection coefficient at the source end and the phases of the reflection coefficient at the source and load ends of the multi-stub tuner for each pair of stubs in the multi-stub tuner.

12. The method of claim 1 wherein the step of measuring the reflection coefficient comprises receiving signals from a plurality of detectors positioned along a waveguide between the source and the load.

13. The method of claim 1 wherein the multi-stub tuner is a three-stub tuner.

14. The method of claim 1 wherein the predetermined value of the magnitude of the reflection coefficient in step g is 0.1.

* * * * *